US012733342B2

(12) United States Patent
Park et al.

(10) Patent No.: US 12,733,342 B2
(45) Date of Patent: Sep. 8, 2026

(54) ORGANIC LIGHT-EMITTING DISPLAY DEVICE

(71) Applicant: LG Display Co., Ltd., Seoul (KR)

(72) Inventors: Sungmin Park, Seoul (KR); Sujin Chae, Goyang-si (KR); Minji Han, Gimpo-si (KR); Taekyeong Lee, Goyang-si (KR); Youngjae Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 817 days.

(21) Appl. No.: 17/971,459

(22) Filed: Oct. 21, 2022

(65) Prior Publication Data

US 2023/0200134 A1 Jun. 22, 2023

(30) Foreign Application Priority Data

Dec. 22, 2021 (KR) ........................ 10-2021-0184524

(51) Int. Cl.
*H10K 59/121* (2023.01)
*H10D 86/40* (2025.01)
(Continued)

(52) U.S. Cl.
CPC ....... *H10K 59/1213* (2023.02); *H10D 86/423* (2025.01); *H10D 86/441* (2025.01);
(Continued)

(58) Field of Classification Search
CPC ......... G09G 3/3233; G09G 2300/0861; G09G 2310/0251; G09G 2320/0233; G09G 2320/043; G09G 2320/0238; G09G 2300/0819; G09G 2310/0262; H10D 86/60; H10D 86/423; H10D 86/441;
(Continued)

(56) References Cited

U.S. PATENT DOCUMENTS 10,056,034 B2 8/2018 Zhu et al.
11,211,010 B2 12/2021 Yuan
(Continued)

FOREIGN PATENT DOCUMENTS

CN 106710528 A 5/2017
CN 108470539 A 8/2018
(Continued)

*Primary Examiner* — Shaheda A Abdin
(74) *Attorney, Agent, or Firm* — Birch, Stewart, Kolasch & Birch, LLP

(57) ABSTRACT

An organic light-emitting display device can include a plurality of pixels arranged in a display panel. Each pixel includes an organic light-emitting element configured to emit light based on drive current, and a driving transistor configured to control the drive current. The driving transistor includes a source electrode acting as a first node, a gate electrode acting as a second node, and a drain electrode acting as a third node. Each pixel further includes a first transistor connecting the second node and the third node to each other in a diode manner, a second transistor configured to apply a data voltage to the first node, a third transistor configured to apply a high potential drive voltage to the first node, and a fourth transistor configured to form a current path between the driving transistor and the organic light-emitting element.

15 Claims, 12 Drawing Sheets

(51) Int. Cl.
*H10D 86/60* (2025.01)
*H10K 59/131* (2023.01)

(52) U.S. Cl.
CPC ........... *H10D 86/481* (2025.01); *H10D 86/60* (2025.01); *H10K 59/1216* (2023.02); *H10K 59/131* (2023.02)

(58) Field of Classification Search
CPC ............... H10D 86/481; H10K 59/131; H10K 59/1216; H10K 59/1213
See application file for complete search history.

(56) References Cited

U.S. PATENT DOCUMENTS

| | | | | |
|---|---|---|---|---|
| 11,393,399 | B2 | 7/2022 | Na | |
| 11,580,906 | B2 | 2/2023 | Wang et al. | |
| 11,869,423 | B2 | 1/2024 | Gao et al. | |
| 12,223,903 | B2 | 2/2025 | Gao et al. | |
| 2015/0123557 | A1* | 5/2015 | Lee | G09G 3/3233 315/228 |
| 2015/0138180 | A1* | 5/2015 | Park | G09G 3/3233 345/212 |
| 2017/0110054 | A1* | 4/2017 | Sun | G09G 3/3291 |
| 2020/0226978 | A1* | 7/2020 | Lin | H10K 59/1213 |
| 2020/0273411 | A1 | 8/2020 | Gao et al. | |
| 2021/0174739 | A1* | 6/2021 | Lu | G09G 3/3225 |
| 2021/0280130 | A1 | 9/2021 | Wang et al. | |
| 2021/0366397 | A1 | 11/2021 | Na | |
| 2022/0122534 | A1* | 4/2022 | Kim | G09G 3/3233 |
| 2023/0169923 | A1 | 6/2023 | Wang et al. | |
| 2024/0046880 | A1* | 2/2024 | Han | G09G 3/3233 |

FOREIGN PATENT DOCUMENTS

| | | | |
|---|---|---|---|
| CN | 109599062 | A | 4/2019 |
| CN | 111435587 | A | 7/2020 |
| CN | 112102785 | A | 12/2020 |
| CN | 113707090 | A | 11/2021 |
| KR | 10-2016-0141366 | A | 12/2016 |
| KR | 10-2021-0111945 | A | 9/2021 |
| KR | 10-2021-0143970 | A | 11/2021 |

* cited by examiner

ORGANIC LIGHT-EMITTING DISPLAY DEVICE

CROSS-REFERENCE TO RELATED APPLICATIONS

This application claims priority to Korean Patent Application No. 10-2021-0184524, filed on Dec. 22, 2021 in the Korean Intellectual Property Office, and all the benefits accruing therefrom under 35 U.S.C. 119, the entire contents of which are hereby expressly incorporated by reference into the present application.

BACKGROUND OF THE DISCLOSURE

Field

The present disclosure relates to an organic light-emitting display device, and more particularly, to an organic light-emitting display device in which an organic light-emitting element emits light based on a light-emission signal.

Description of Related Art

An organic light-emitting element (e.g., organic light emitting diode OLED) as a self-emissive element includes anode and cathode electrodes and an organic compound layer formed therebetween. The organic compound layer is composed of a hole transport layer (HTL), a light-emissive layer (EML), and an electron transport layer (ETL). When a drive voltage is applied to the anode and cathode electrodes, holes passing through the hole transport layer (HTL) and electrons passing through the electron transport layer (ETL) move to the light-emissive layer (EML) and are combined with each other therein to form excitons, and as a result, the light-emissive layer (EML) emits visible light. An active matrix type organic light-emitting display device includes an organic light-emitting element (OLED) that emits light by itself, and has a fast response speed, high luminous efficiency, and luminance and a wide viewing angle and thus is widely used.

In the organic light-emitting display device, pixels respectively including organic light-emitting elements are arranged in a matrix form, and luminance levels of the pixels are adjusted based on a gray level of video data. Each of the pixels includes an organic light-emitting element, a driving transistor that controls a drive current flowing through the organic light-emitting element based on a gate-source voltage, and at least one switch transistor that programs the gate-source voltage of the driving transistor. A pixel circuit including an organic light-emitting element, a driving transistor and at least one switch transistor operates based on a scan signal and a light-emission signal.

Thus, the pixel circuit supplies the drive current to the organic light-emitting element based on the scan signal and the light-emission signal. In this regard, charge sharing occurs in some nodes of the pixel circuit. Thus, a black failure phenomenon can occur when the organic light-emitting element emits light, or the luminance levels of the display panel may become non-uniform.

SUMMARY OF THE DISCLOSURE

The Inventors of the present disclosure have invented an organic light-emitting display device in which a pixel circuit is newly designed in order to remove or address the above-described problem and other limitations.

Accordingly, a purpose of the present disclosure is to provide an organic light-emitting display device that can remove or minimize the black failure phenomenon.

Another purpose of the present disclosure is to provide an organic light-emitting display device capable of uniformizing luminance levels of pixels.

Purposes of the present disclosure are not limited to the above-mentioned purpose. Other purposes and advantages of the present disclosure that are not mentioned can be understood based on following descriptions, and can be more clearly understood based on embodiments of the present disclosure. Further, it will be easily understood that the purposes and advantages of the present disclosure can be realized using means shown in the claims and combinations thereof.

One aspect of the present disclosure provides an organic light-emitting display device comprising a plurality of pixels arranged in a display panel. Each of the plurality of pixels includes an organic light-emitting element for emitting light based on drive current, a driving transistor for controlling the drive current, wherein the driving transistor includes a source electrode acting as a first node, a gate electrode acting as a second node, and a drain electrode acting as a third node, a first transistor for connecting the second node and the third node to each other in a diode manner, a second transistor for applying a data voltage to the first node, a third transistor for applying a high potential drive voltage VDD to the first node, a fourth transistor for forming a current path between the driving transistor and the organic light-emitting element, a fifth transistor for selectively applying a stress voltage Vobs and an initialization voltage Vini to the third node, and a sixth transistor for applying a reset voltage VAR to a fourth node as an anode electrode of the organic light-emitting element.

One aspect of the present disclosure provides an organic light-emitting display device comprising a plurality of pixels arranged in a display panel, wherein each of the plurality of pixels includes an organic light-emitting element, a driving transistor for supplying drive current to the organic light-emitting element, wherein the driving transistor includes a source electrode acting as a first node, a gate electrode acting as a second node, and a drain electrode acting as a third node, and a reset transistor for applying a reset voltage to a fourth node as an anode electrode of the organic light-emitting element, wherein each of the plurality of pixels operates separately in a stress period, an initial period, a sampling period, a reset period, and an emission period, wherein during the stress period, a bias stress is applied to the driving transistor, wherein during the initial period, the second node or the third node is initialized based on an initialization voltage, wherein during the sampling period, the second node is charged to a voltage corresponding to a sum of a data voltage and a threshold voltage of the driving transistor, wherein during the reset period, the reset transistor resets the fourth node based on the reset voltage, wherein during the emission period, the drive current is applied to the organic light-emitting element so that the organic light-emitting element emits light.

One aspect of the present disclosure provides an organic light-emitting display device comprising a plurality of pixels arranged in a display panel, wherein each of the plurality of pixels includes an organic light-emitting element, a driving transistor for supplying drive current to the organic light-emitting element, wherein the driving transistor includes a source electrode acting as a first node, a gate electrode acting as a second node, and a drain electrode acting as a third node, and a reset transistor for applying a reset voltage to a fourth node as an anode electrode of the organic light-emitting element so that the third node and the fourth node are at the same potential equal to the reset voltage during a reset period in a refresh frame, wherein in the refresh frame, a data voltage is programmed in the pixel, the reset period is a period for which a voltage level of the anode electrode of the organic light-emitting element is fixed to the reset voltage for a rest of the period except for a emission period in the refresh frame, and during the emission period, the drive current is applied to the organic light-emitting element so that the organic light-emitting element emits light.

The specific details of other embodiments are included in the detailed description and drawings.

In accordance with the present disclosure, an anode electrode of the organic light-emitting element can maintain a constant voltage level so that luminance variation of the organic light-emitting display device can be minimized and thus, image quality thereof can be improved.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
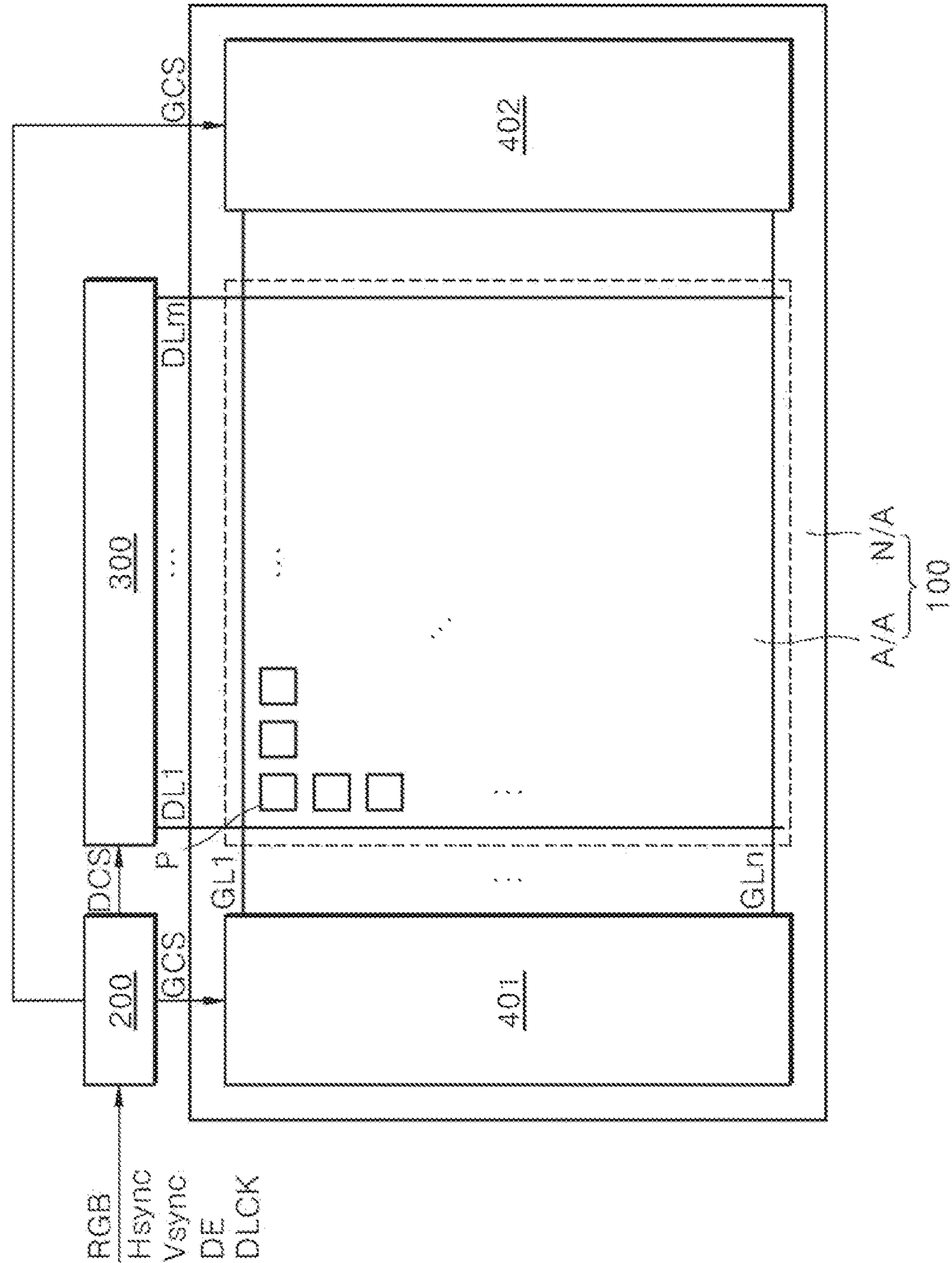
FIG. 1 is a block diagram of an organic light-emitting display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprises", "including", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

As used herein, the term "substantially," "about," and similar terms are used as terms of approximation, and are intended to account for inherent deviations in measured or calculated values that would be recognized by those of ordinary skill in the art. The term can be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the embodiments of the present disclosure will be described in detail with reference to the drawings. All the components of each organic light-emitting display device according to all embodiments of the present disclosure are operatively coupled and configured.

FIG. 1 is a block diagram of an organic light-emitting display device according to one embodiment of the present disclosure.

Referring to FIG. 1, an organic light-emitting display device according to one embodiment of the present disclosure includes a display panel 100, a timing control circuit 200, a data driver 300, and gate drivers 401 and 402.

The display panel 100 include a display area A/A for displaying an image, and a non-display area N/A located outside the display area A/A. Various signal lines and the gate drivers 401 and 402 are disposed in the non-display area.

A plurality of pixels P are disposed in the display area A/A to display an image. In addition, in the display area A/A, n gate lines GL1 to GLn extending in a first direction and m data lines DL1 to DLm extending in a direction different from the first direction are arranged. Here, n and m are positive numbers such as positive integers. The plurality of pixels P are electrically connected to the n gate lines GL1 to GLn and the m data lines DL1 to DLm. Accordingly, a gate voltage is applied to each of the pixels P through each of the gate lines GL1 to GLn, and a data voltage is applied to each of the pixels P through each of the data lines DL1 to DLm. Moreover, each pixel P renders a gray level based on the gate voltage and the data voltage. Finally, an image is displayed from the display area A/A based on the gray level displayed from each pixel P.

In the non-display area N/A, the various signal lines that transmit the signals for controlling operations of the pixels P arranged in the display area A/A and the gate drivers 401 and 402 are arranged.

The timing control circuit 200 transmits an input image signal RGB received from a host system to the data driver 300.

The timing control circuit 200 generates control signals GCS and DCS to control operation timings of the gate drivers 401 and 402 and the data driver 300 based on timing signals such as a clock signal DCLK, a horizontal synchronization signal Hsync, a vertical synchronization signal Vsync and a data enable signal DE received along with the image data RGB. In this regard, a horizontal sync signal Hsync refer to a signal that indicates a time it takes to display one horizontal line of a screen, the vertical sync signal Vsync refers to a signal that indicates a time it takes to display one frame of the screen, and the data enable signal DE refers to a signal to indicate a period for which data voltage is supplied to a pixel P defined in the display panel 100.

In other words, the timing control circuit 200 receives the timing signals, outputs the gate control signal GCS to the gate drivers 401 and 402, and outputs the data control signal DCS to the data driver 300.

The data driver 300 receives the data control signal DCS and outputs the data voltage to the data lines DL1 to DLm.

Specifically, the data driver 300 generates a sampling signal based on the data control signal DCS, latches the image data RGB based on the sampling signal and changes the image data to the data voltage, and then, supplies the data voltage to the data lines DL1 to DLm in response to a source output enable (SOE) signal.

The data driver 300 can be connected to a bonding pad of the display panel 100 in a COG (Chip On Glass) scheme, or can be directly disposed on the display panel 100. In some cases, the data driver can be integrated into the display panel 100. In addition, the data driver 300 can be disposed in a COF (Chip On Film) scheme.

Each of the gate drivers 401 and 402 can sequentially supply a scan signal, a light-emission signal, and a reset signal corresponding to a gate voltage to the gate lines GL1 to GLn based on the gate control signal GCS.

Generally, the gate drivers 401 and 402 can be formed independently of the display panel 100 and can be electrically connected to the display panel in various schemes. However, the gate drivers 401 and 402 of the organic light-emitting display device according to one embodiment of the present disclosure can be formed in a form of a thin-film pattern when manufacturing a substrate of the display panel 100, and then can be embedded on the non-display area N/A in a GIP (Gate In Panel) scheme.

Moreover, the gate drivers 401 and 402 can include a first gate driver 401 and a second gate driver 402 respectively disposed on both opposing sides of the display panel 100.

Specifically, the first gate driver 401 supplies a scan signal and a reset signal to a plurality of pixels P. Accordingly, the first gate driver 401 can include a plurality of scan driving stages and a plurality of reset driving stages. Moreover, the plurality of scan driving stages supply the scan signal to the plurality of pixels P, while the plurality of reset driving stages supply the reset signal to the plurality of pixels P.

Moreover, the second gate driver 402 supplies the scan signal and the light-emission signal to the plurality of pixels P. Accordingly, the second gate driver 402 can include a plurality of scan driving stages and a plurality of light-emission driving stages. Moreover, the plurality of scan driving stages supply the scan signal to the plurality of pixels P, while the plurality of light-emission driving stages supply the light-emission signal to the plurality of pixels P.

Hereinafter, a configuration and a driving scheme of the plurality of pixels P will be described in detail.

Each of switch elements constituting each of the plurality of pixels P can be implemented as a transistor having an n-type or p-type MOSFET structure. Although an example in which the switch element is embodied as an n-type transistor is illustrated hereinafter, the present disclosure is not limited thereto.

Additionally, the transistor is a three-electrode element including a gate electrode, a source electrode and a drain electrode. The source electrode supplies a carrier to the transistor. In the transistor, the carriers can flow from the source electrode. The drain electrode refers to an electrode through which the carrier exits the transistor. For example, in the MOSFET, the carriers flow from the source electrode to the drain electrode. In an n-type MOSFET (NMOS), the carrier is an electron, and thus, a voltage of the source electrode is lower than a voltage of the drain electrode so that the electrons can flow from the source electrode to the drain electrode. In the n-type MOSFET, the electrons flow from the source electrode to the drain electrode, such that current flows from the drain electrode to the source electrode. In a p-type MOSFET (PMOS), carriers are hole holes, and thus the voltage of the source electrode is higher than the voltage of the drain electrode so that holes can flow from the source electrode to the drain electrode. In the p-type MOSFET, current flows from the source electrode to the drain electrode because the holes flow from the source electrode to the drain electrode. It should be noted that the source and drain electrodes of the MOSFET are not fixed. For example, the source electrode and the drain electrode of the MOSFET can be exchanged based on an applied voltage thereto. The disclosure should not be limited to the source electrode and the drain electrode of the transistor in following embodiments.

Figure 2:
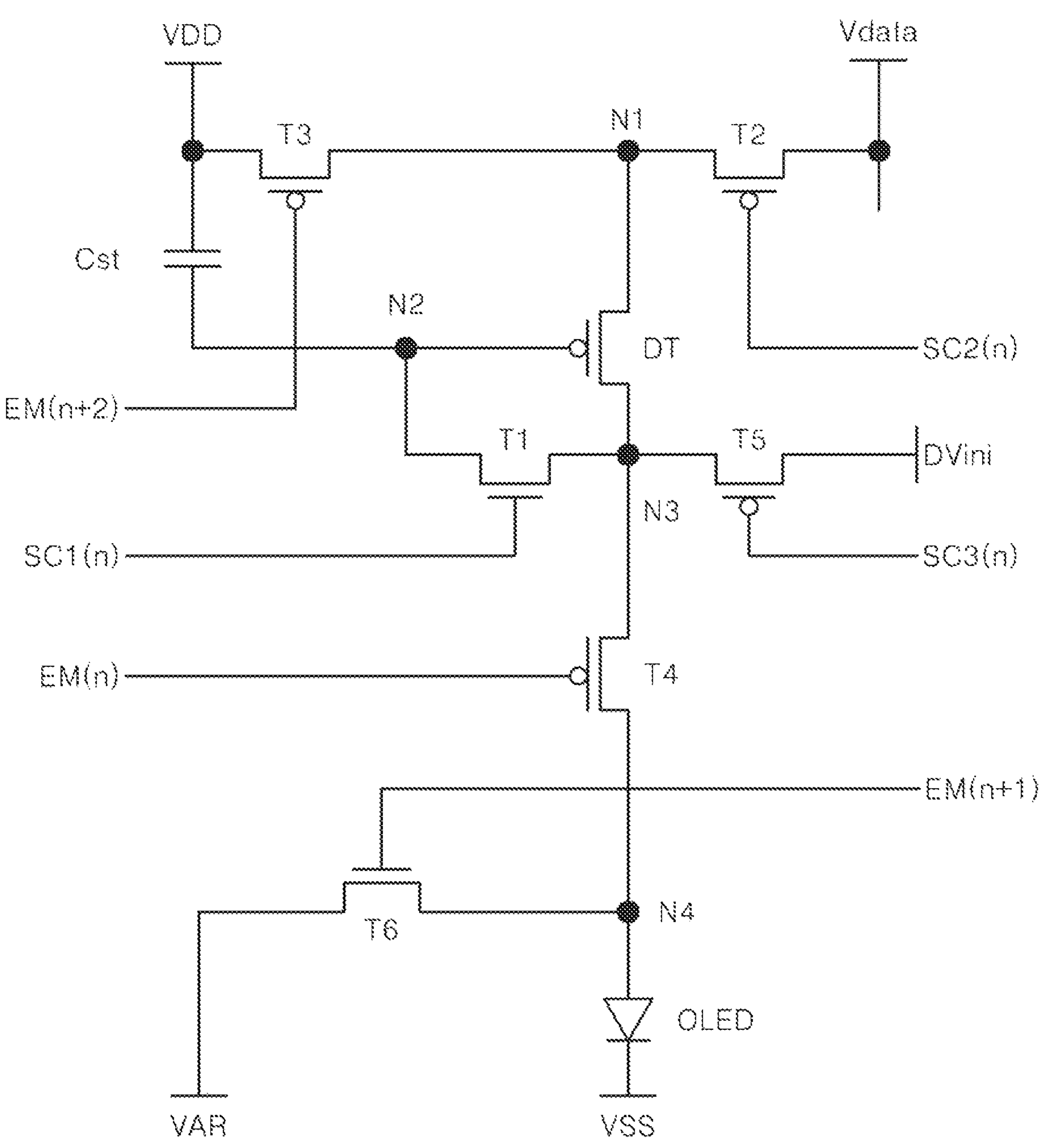
FIG. 2 is a circuit diagram showing a pixel of an organic light-emitting display device according to one embodiment of the present disclosure.

FIG. 2 is a circuit diagram showing a pixel of an organic light-emitting display device according to one embodiment of the present disclosure.

Referring to FIG. 2, each pixel P includes an organic light-emitting element OLED, a driving transistor DT, first to sixth transistors T1 to T6. Each pixel P can further include a capacitor Cst.

The organic light-emitting element OLED emits light using drive current supplied thereto from the driving transistor DT. An organic compound layer composed of multiple layers is formed between an anode electrode and a cathode electrode of the organic light-emitting element OLED. The organic compound layer can include at least one hole transfer layer, and at least one electron transfer layer, and a light-emissive layer (EML). In this regard, the hole transfer layer acts as a layer that injects or transports holes into the light-emissive layer, and can include, for example, a hole injection layer (HIL), a hole transport layer (HTL), and an electron blocking layer (EBL), or the like. Moreover, the electron transfer layer acts as a layer that injects or transfers electrons to the light-emissive layer, and can include, for example, an electron transport layer (ETL), an electron injection layer (EIL), and a hole blocking layer (HBL), or the like. The anode electrode of the organic light-emitting element OLED is connected to a fourth node N4, and the cathode electrode of the organic light-emitting element is connected to an input terminal of a low potential drive voltage VSS.

The driving transistor DT controls the drive current applied to the organic light-emitting element OLED based on a source-gate voltage Vsg thereof. The driving transistor DT can be embodied as a p-type MOSFET (PMOS), or as an LTPS (Low-Temperature Polycrystalline Silicon) thin-film transistor. Moreover, a source electrode of the driving transistor DT is connected to the first node N1, a gate electrode thereof is connected to the second node N2, and a drain electrode thereof is connected to the third node N3.

A first transistor T1 connects the gate electrode and the drain electrode to each other in a diode manner. The first transistor T1 can be embodied as an n-type MOSFET (NMOS) or an oxide thin-film transistor in order to minimize leakage current. The first transistor T1 includes a drain electrode connected to the third node N3, a source electrode connected to the second node N2, and a gate electrode connected to a first scan signal line transmitting a first scan signal SC1(*n*). Accordingly, the first transistor T1 connects the gate electrode and the drain electrode of the driving transistor DT to each other in a diode manner in response to the first scan signal SC1(*n*) of a high level as a turn-on level.

A second transistor T2 applies data voltage Vdata supplied from the data line to the first node N1 as the source electrode of the driving transistor DT. The second transistor T2 can be embodied as a p-type MOSFET (PMOS), or an LTPS (Low-Temperature Polycrystalline Silicon) thin-film transistor. The second transistor T2 includes a source electrode connected to the data line, a drain electrode connected to the first node N1, and a gate electrode connected to a second scan signal line transmitting a second scan signal SC2(*n*). Accordingly, the second transistor T2 applies the data voltage Vdata supplied from the data line to the first node N1 as the source electrode of the driving transistor DT in response to the second scan signal SC2(*n*) of a low level as a turn-on level.

A third transistor T3 applies a high potential drive voltage VDD to the first node N1 as the source electrode of the driving transistor DT. The third transistor T3 can be embodied as a p-type MOSFET (PMOS) or an LTPS (Low-Temperature Polycrystalline Silicon) thin-film transistor. The third transistor T3 includes a source electrode connected to a high potential drive voltage line transmitting the high potential drive voltage VDD, a drain electrode connected to the first node N1, and a gate electrode connected to a light-emission signal line transmitting a third light-emission signal EM(n+2). Accordingly, the third transistor T3 applies the high potential drive voltage VDD to the first node N1 as the source electrode of the driving transistor DT, in response to the third light-emission signal EM(n+2) of a low level as a turn-on level.

A fourth transistor T4 constitutes a current path between the driving transistor DT and the organic light-emitting element OLED. The fourth transistor T4 can be embodied as a p-type MOSFET (PMOS) or an LTPS (Low-Temperature Polycrystalline Silicon) thin-film transistor. The fourth transistor T4 includes a source electrode connected to the third node N3, a drain electrode connected to the fourth node N4, and a gate electrode connected to a light-emission signal line transmitting a first light-emission signal EM(n). The fourth transistor T4 constitutes a current path between the third node N3 as the source electrode of the fourth transistor T4 and the fourth node N4 as the drain electrode of the fourth transistor T4 in response to the first light-emission signal EM(n). Accordingly, the fourth transistor T4 constitutes a current path between the driving transistor DT and the organic light-emitting element OLED in response to the first light-emission signal EM(n) of a low level as a turn-on level.

A fifth transistor T5 applies an initialization voltage Vini to the third node N3 as the drain electrode of the driving transistor DT. The fifth transistor T5 can be embodied as a p-type MOSFET (PMOS) or an LTPS (Low-Temperature Polycrystalline Silicon) thin-film transistor. The fifth transistor T5 includes a source electrode connected to a digital initialization voltage line DVini that selectively transmits an on bias stress voltage Vobs (hereinafter, referred to as "stress voltage") and the initialization voltage Vini, a drain electrode connected to the third node N3, and a gate electrode connected to a third scan signal line transmitting a third scan signal SC3(*n*). Accordingly, the fifth transistor T5 applies the initialization voltage Vini to the third node N3 as the drain electrode of the driving transistor DT, in response to the third scan signal SC3(*n*) of a low level as a turn-on level. Further, the stress voltage Vobs and the initialization voltage Vini supplied through the digital initialization voltage line DVini can have different voltage levels. The stress voltage Vobs can have a level greater than that of the initialization voltage Vini.

A sixth transistor T6 (which can be referred to be a reset transistor) applies a reset voltage VAR to the fourth node N4 as an anode electrode of the organic light-emitting element. The sixth transistor T6 can be embodied as a p-type MOSFET (PMOS) or can be embodied as an n-type MOSFET (NMOS) to use the light-emission signal in common without adding a separate signal, or can be embodied as an oxide thin-film transistor. The sixth transistor T6 includes a source electrode connected to a reset voltage line transmitting the reset voltage VAR, a drain electrode connected to the fourth node N4, and a gate electrode connected to a light-emission signal line transmitting a second light-emission signal EM(n+1). Accordingly, the sixth transistor T6 applies the reset voltage VAR to the fourth node N4 as the anode of the organic light-emitting element in response to the second light-emission signal EM(n+1) of a high level as a turn-on level.

The storage capacitor Cst includes a first electrode connected to the second node N2 and a second electrode connected to the high potential drive voltage line transmitting the high potential drive voltage VDD. For example, one electrode of the storage capacitor Cst is connected to the gate electrode of the driving transistor DT, while the other electrode of the storage capacitor Cst is connected to the source electrode of the third transistor T3.

Figure 3:
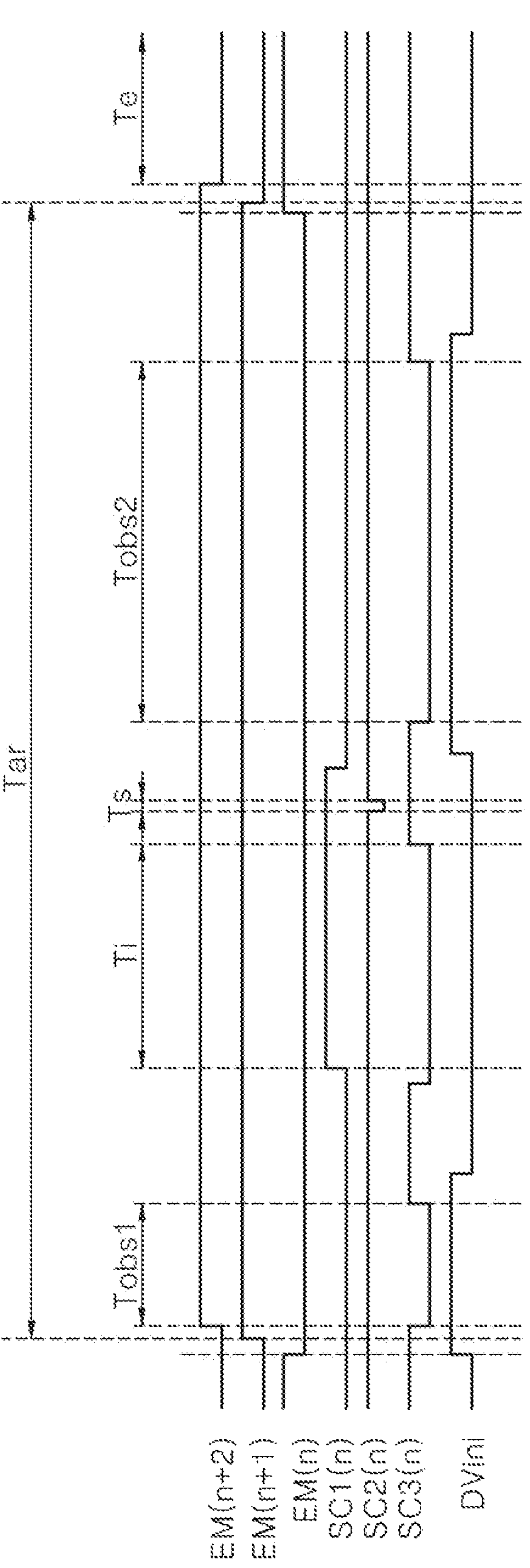
FIG. 3 is a waveform diagram showing each of a light-emission signal and a scan signal of an organic light-emitting display device according to one embodiment of the present disclosure during a refresh frame.

FIG. 3 is a waveform diagram showing each of a light-emission signal and a scan signal of an organic light-emitting display device according to one embodiment of the present disclosure during a refresh frame.

Figure 4:
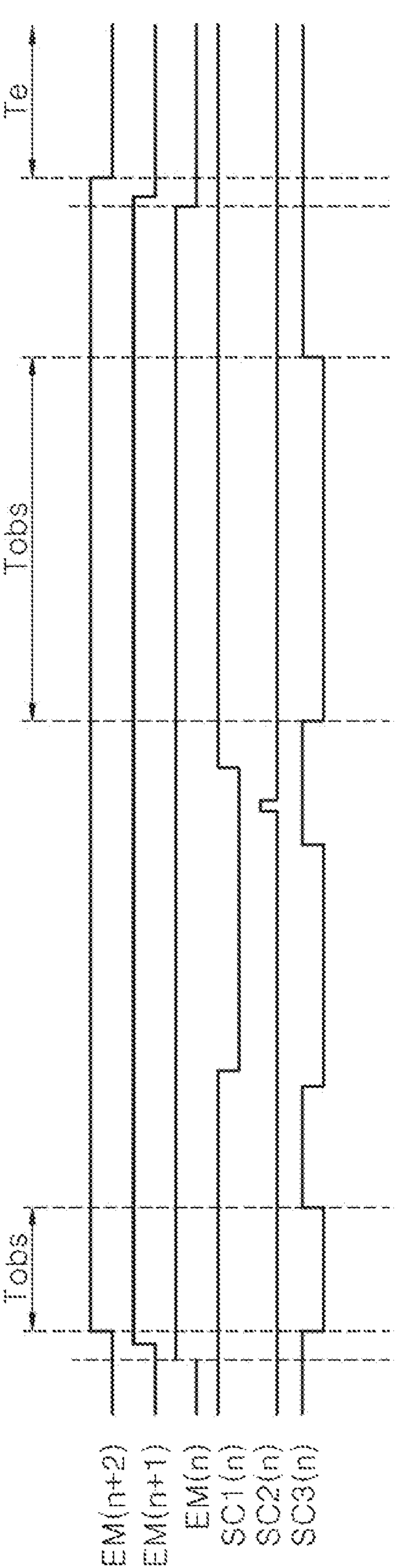
FIG. 4 is a waveform diagram showing each of a light-emission signal and a scan signal of an organic light-emitting display device according to one embodiment of the present disclosure during a reset frame.

FIG. 4 is a waveform diagram showing each of a light-emission signal and a scan signal of an organic light-emitting display device according to one embodiment of the present disclosure during a reset frame.

Figure 5A:
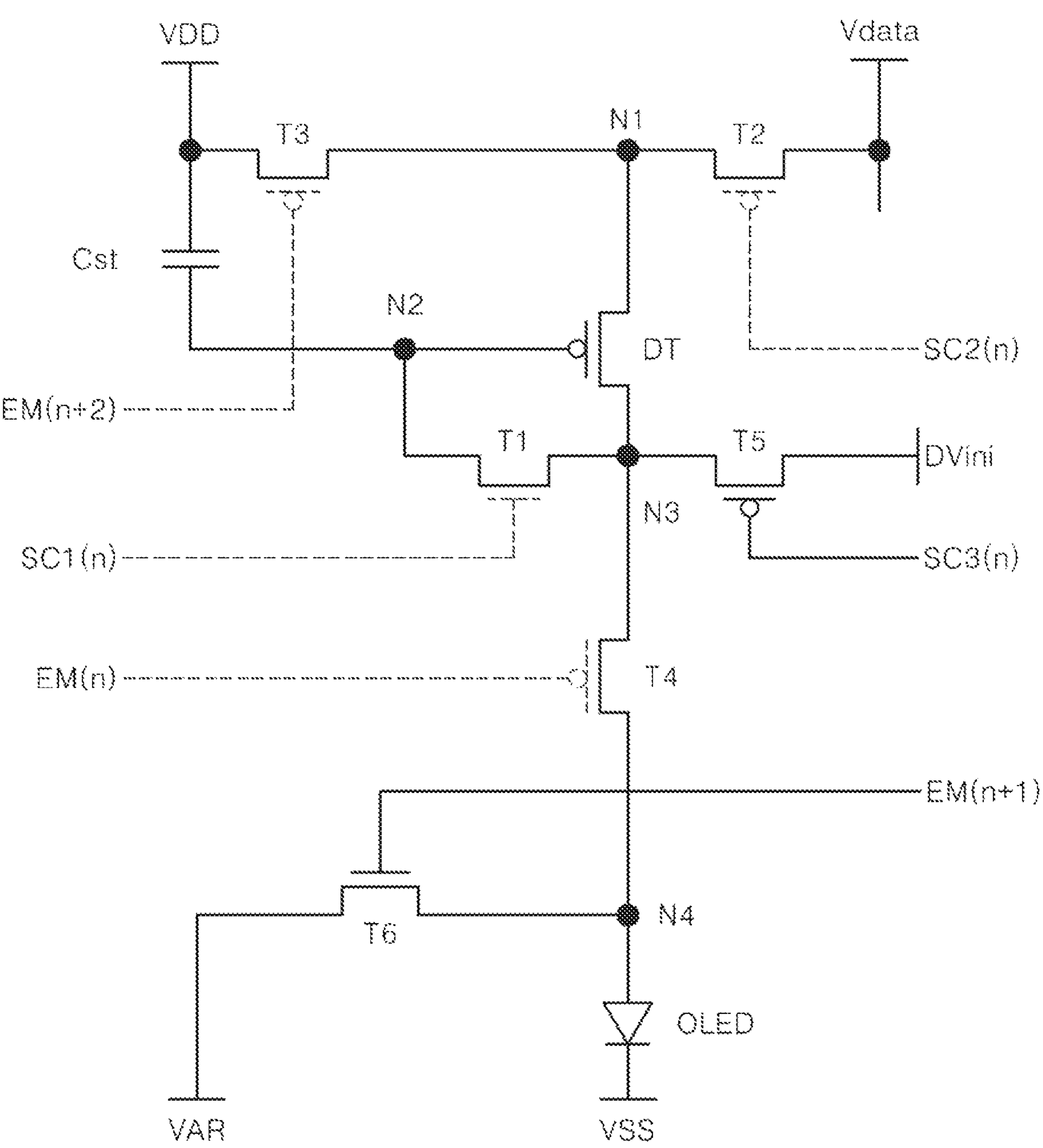
FIG. 5A is a circuit diagram of a pixel of an organic light-emitting display device according to one embodiment of the present disclosure during an on bias stress period.

FIG. 5A is a circuit diagram of a pixel of an organic light-emitting display device according to one embodiment of the present disclosure during an on bias stress period.

Figure 5B:
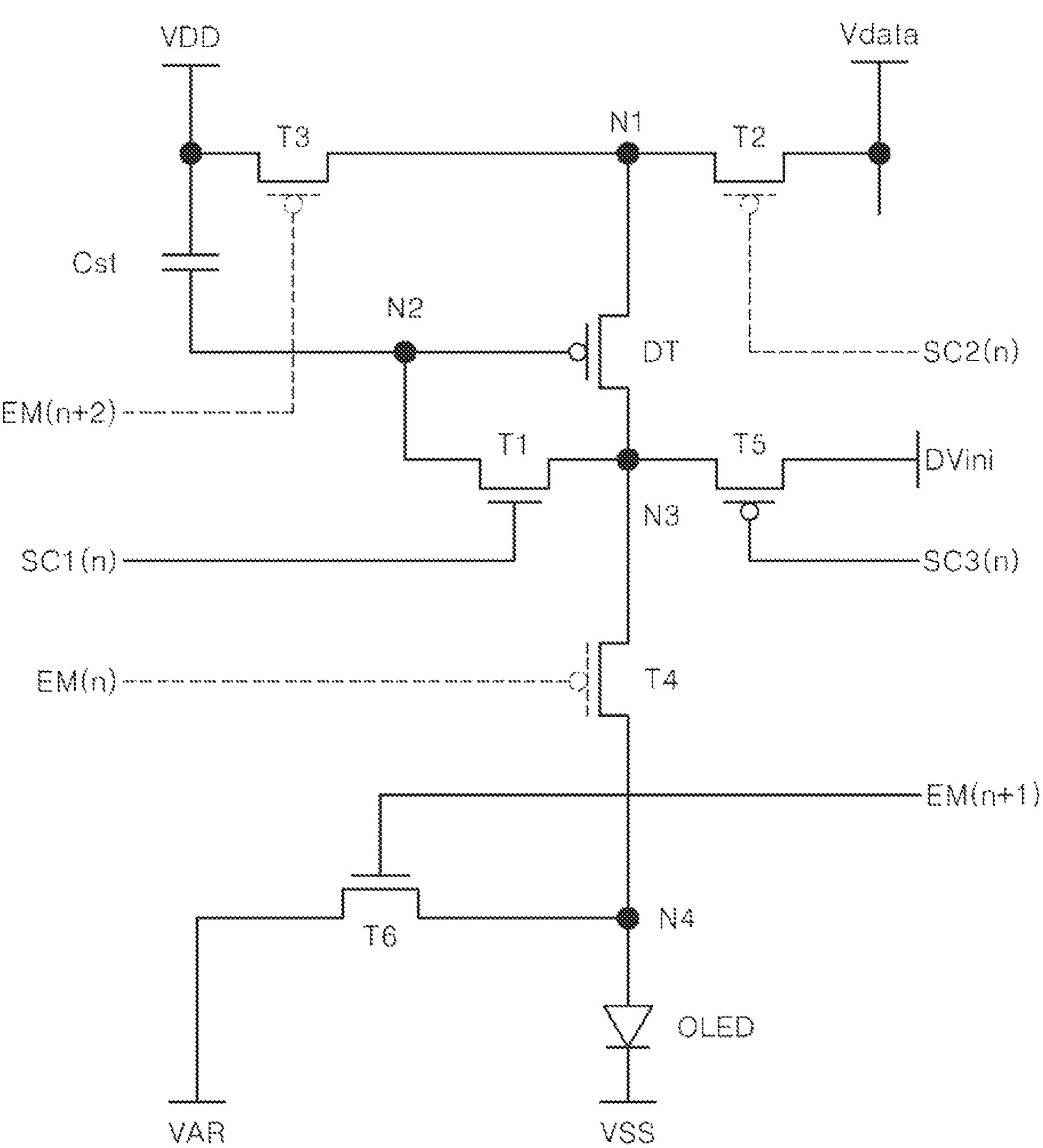
FIG. 5B is a circuit diagram of a pixel of an organic light-emitting display device according to one embodiment of the present disclosure during an initial period.

FIG. 5B is a circuit diagram of a pixel of an organic light-emitting display device according to one embodiment of the present disclosure during an initial period.

Figure 5C:
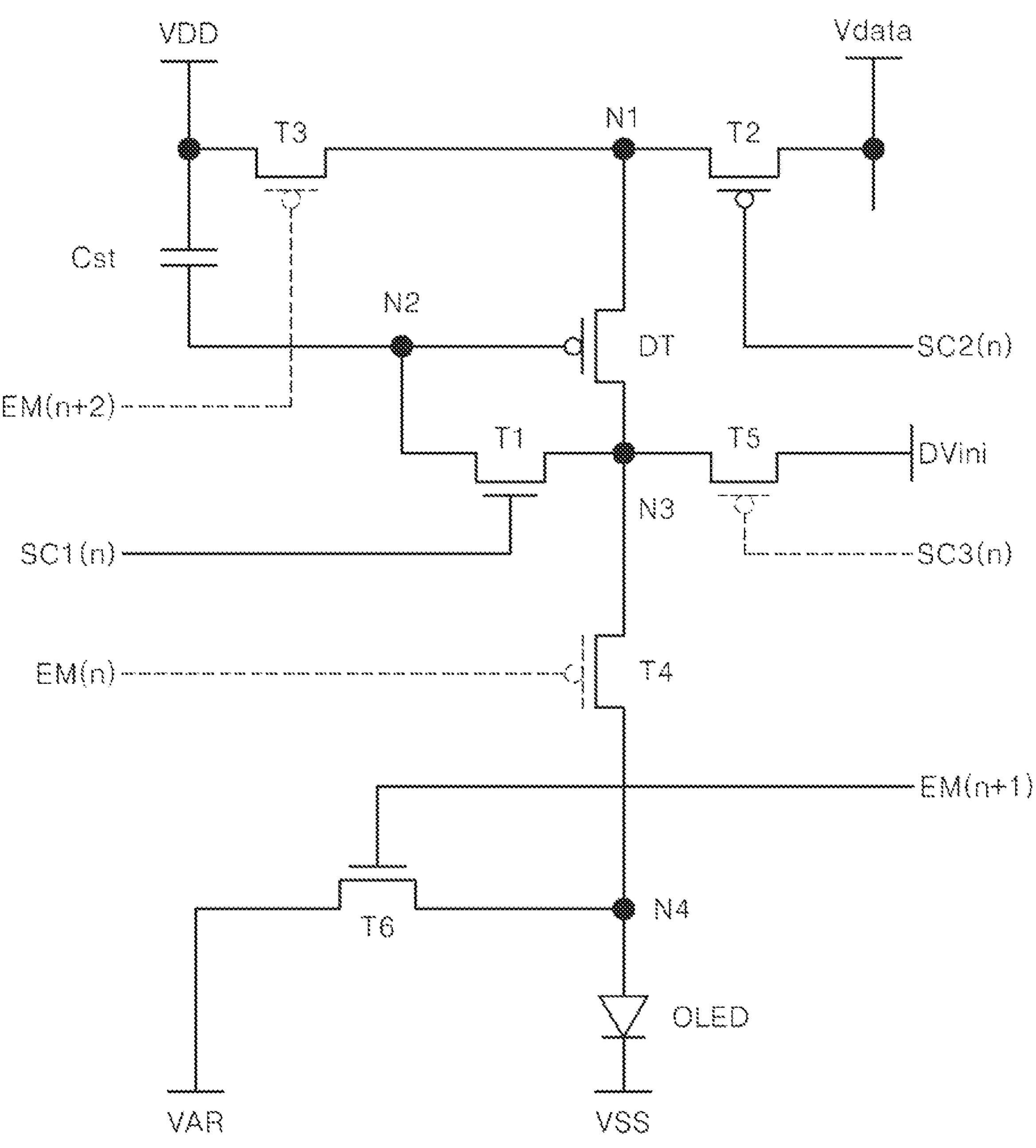
FIG. 5C is a circuit diagram of a pixel of an organic light-emitting display device according to one embodiment of the present disclosure during a sampling period.

FIG. 5C is a circuit diagram of a pixel of an organic light-emitting display device according to one embodiment of the present disclosure during a sampling period.

Figure 5D:
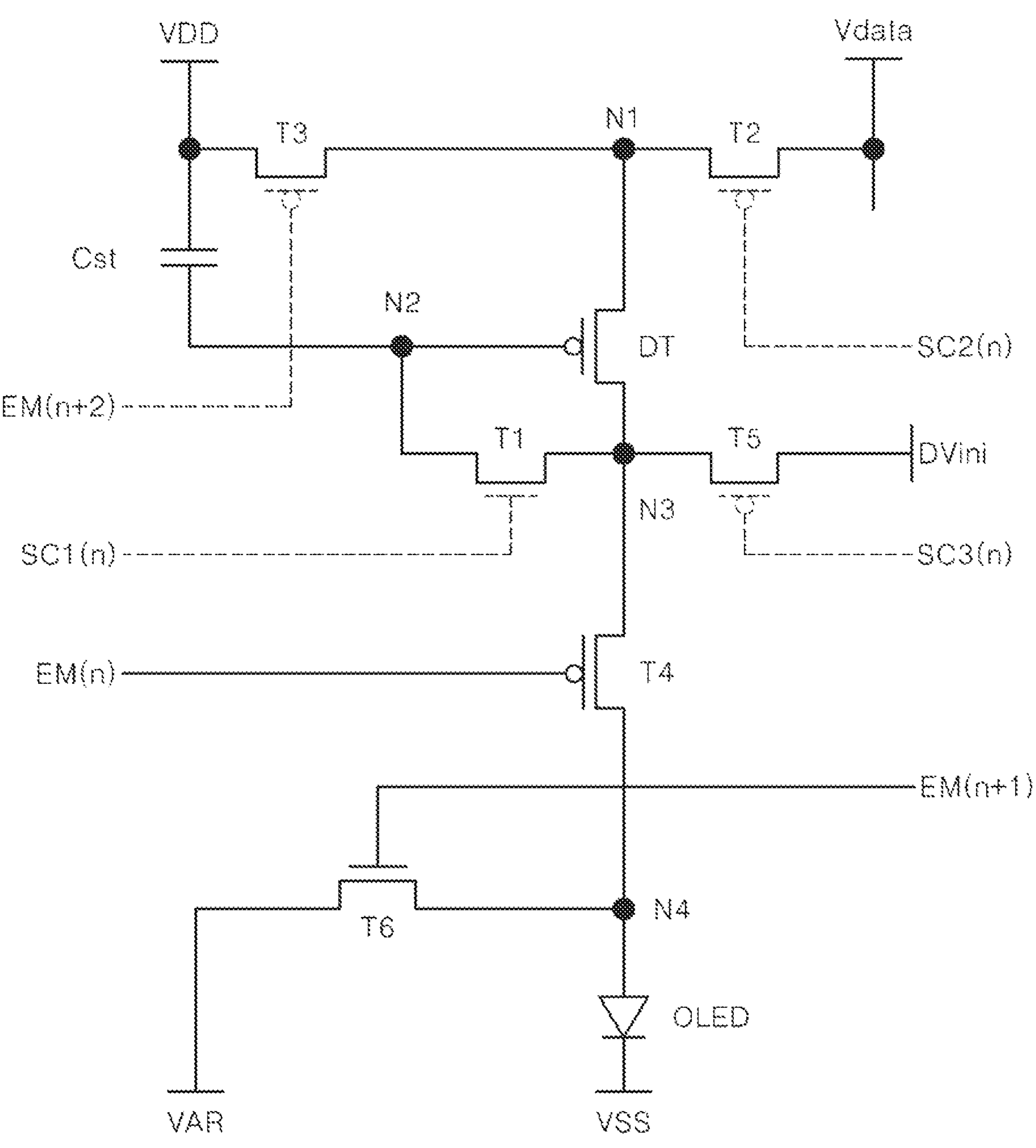
FIG. 5D is a circuit diagram of a pixel of an organic light-emitting display device according to one embodiment of the present disclosure during an anode reset period.

FIG. 5D is a circuit diagram of a pixel of an organic light-emitting display device according to one embodiment of the present disclosure during an anode reset period.

Figure 5E:
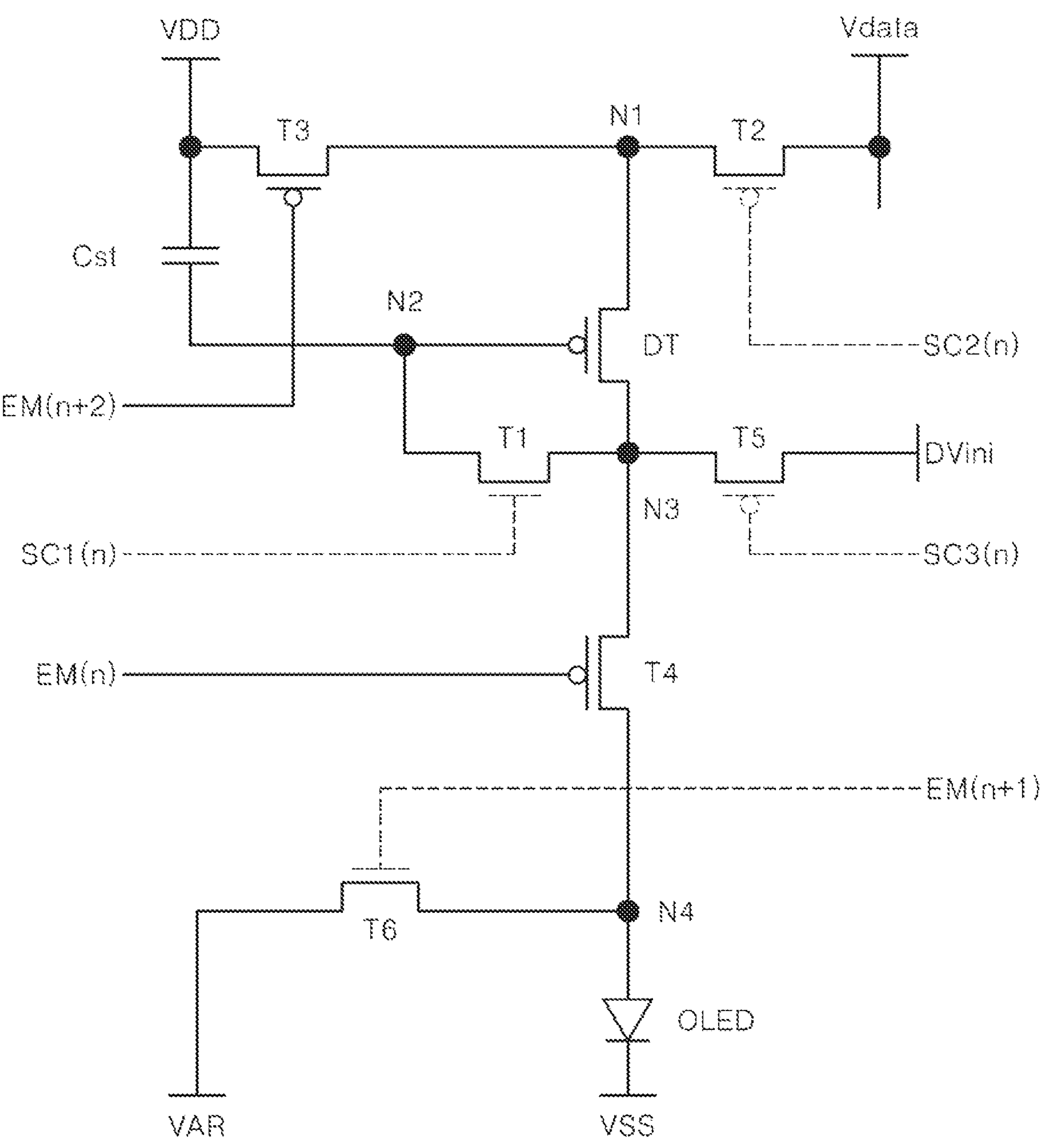
FIG. 5E is a circuit diagram of a pixel of an organic light-emitting display device according to one embodiment of the present disclosure during an emission period.

FIG. 5E is a circuit diagram of a pixel of an organic light-emitting display device according to one embodiment of the present disclosure during an emission period.

Referring to FIG. 2 to FIG. 5E, an operation of the organic light-emitting display device according to one embodiment of the present disclosure will be described as follows.

The organic light-emitting display device according to one embodiment of the present disclosure can operate separately in a refresh frame and a reset frame. For the refresh frame, the data voltage Vdata is programmed in each pixel P, and the organic light-emitting element OLED emits light. Moreover, the reset frame can be a vertical blank frame. An anode of the organic light-emitting element OLED is reset for the reset frame.

In the organic light-emitting display device according to one embodiment of the present disclosure, the refresh frame can be divided into an on bias stress period (hereinafter, referred to as "stress period"), an initial period Ti, a sampling period Ts, an emission period Te and an anode reset period Tar (hereinafter, referred to as "reset period"). The stress period refers to a period for which a bias stress is applied to the first node N1 as the source electrode of the driving transistor DT, and the stress period can include a first stress period Tobs1 and a second stress period Tobs2. The initial period Ti refers to a period for which the voltage of the third node N3 as the drain electrode of the driving transistor DT is initialized. The sampling period Ts refers to a period for which a threshold voltage Vth of the driving transistor DT is sampled and the data voltage Vdata is programmed. The emission period Te refers to a period for which the organic light-emitting element OLED emits light based on the drive current due to the source-gate voltage of the driving transistor DT as programmed. The reset period Tar refers to a period for which a voltage level of the anode electrode of the organic light-emitting element OLED is fixed to the reset voltage VAR for a rest of the period except for the emission period Te.

Specifically, referring to FIG. 3 and FIG. 5A, during a first stress period Tobs1, the second light-emission signal EM(n+1) has a high level as a turn-on level, and the third scan signal SC3(*n*) has a low level as a turn-on level. Accordingly, the sixth transistor T6 is turned on, such that the reset voltage VAR is applied to the fourth node N4. For example, the anode electrode of the organic light-emitting element OLED is reset based on the reset voltage VAR. Moreover, the fifth transistor T5 is turned on, such that a stress voltage Vobs is applied from the digital initialization voltage line DVini to the third node N3. The stress voltage Vobs can be selected from a voltage range sufficiently higher than an operation voltage of the organic light-emitting element OLED, and can be set to a voltage equal to or lower than the high potential drive voltage VDD. For example, the voltage Vgs between the gate and the source of the driving transistor DT can be lowered by applying the bias stress to the third node N3 as the drain electrode of the driving transistor DT during the first stress period Tobs1. Thus, a source drain current Ids of the driving transistor DT can flow during the first stress period Tobs1, such that hysteresis of the driving transistor DT can be reduced. Moreover, referring to FIG. 3 and FIG. 5B, during the initial period Ti, the first scan signal SC1(*n*) has a high level as a turn-on level, the third scan signal SC3(*n*) has a low level as a turn-on level, and the second light-emission signal EM(n+1) has a high level as a turn-on level. Accordingly, the first transistor T1 and the fifth transistor T5 are turned on, such that the initialization voltage Vini from the digital initialization voltage line DVini is applied to the second node N2. As a result, the gate electrode of the driving transistor DT is initialized based on the initialization voltage *Vini*. The initialization voltage Vini can be selected within a voltage range that is sufficiently lower than the operation voltage of the organic light-emitting element OLED, and can be set equal to or lower than the low potential drive voltage VSS. Moreover, during the initial period Ti, the sixth transistor T6 is still turned on, such that the reset voltage VAR is maintained at the fourth node N4.

Moreover, referring to FIG. 3 and FIG. 5C, during the sampling period Ts, the first scan signal SC1(*n*) has a high level as a turn-on level, and the second scan signal SC2(*n*) has a low level as a turn-on level, and the second light-emission signal EM(n+1) has a high level as a turn-on level. Moreover, during the sampling period Ts, the second transistor T2 is turned on, such that the data voltage Vdata is applied to the first node N1. Further, when the first transistor T1 is turned on, such that the driving transistor DT is in a diode-connected state, and thus the gate electrode and the drain electrode of the driving transistor DT are shorted to each other. Thus, the driving transistor DT can act as a diode. During the sampling period Ts, the second node N2 is charged to a voltage corresponding to a sum of the data voltage Vdata and a threshold voltage Vth of the driving transistor DT.

During the sampling period Ts, the current Ids flows between the source and the drain of driving transistor DT. The gate electrode and the drain electrode of the driving transistor DT are in a diode-connected state. Thus, due to the current flowing from the source electrode to the drain electrode, the voltage of the second node N2 increases until the gate-source voltage Vgs of the driving transistor DT reaches Vth.

Moreover, referring to FIG. 3 and FIG. 5A, during the second stress period Tobs2, the second light-emission signal EM(n+1) has a high level as a turn-on level, and the third scan signal SC3(*n*) has a low level as a turn-on level. Accordingly, the sixth transistor T6 is turned on, such that the reset voltage VAR is applied to the fourth node N4. For example, the anode electrode of the organic light-emitting element OLED is reset based on the reset voltage VAR. Moreover, the fifth transistor T5 is turned on such that the stress voltage Vobs is applied to the third node N3. For example, the hysteresis effect of the driving transistor DT can be reduced by applying the bias stress to the third node N3 as the drain electrode of the driving transistor DT, during the second stress period Tobs2.

Moreover, referring to FIG. 3 and FIG. 5D, during the reset period Tar, the first light-emission signal EM(n) has a low level as a turn-on level, and the second light-emission signal EM(n+1) has a high level as a turn-on level. Accordingly, the sixth transistor T6 is turned on, such that the reset voltage VAR is applied to the fourth node N4. For example, the anode electrode of the organic light-emitting element OLED is reset based on the reset voltage VAR. Moreover, the fourth transistor T4 is turned on, such that the third node N3 and the fourth node N4 have the same potential.

In this regard, the sixth transistor T6 is turned on due to the second light-emission signal EM(n+1) having the turn-on level, such that the reset voltage VAR is supplied to the fourth node N4. In other words, because the fourth transistor T4 is embodied as a p-type MOSFET (PMOS) and the sixth transistor T6 is embodied as an n-type MOSFET (NMOS), the third node N3 and the fourth node N4 can have the same potential, for example, the reset voltage VAR level for a period for which the first light-emission signal EM(n) has a low level, and the second light-emission signal EM(n+1) has a high level.

When the sixth transistor T6 is embodied as a p-type MOSFET (PMOS), or when another scan signal such as the third scan signal SC3(*n*) instead of the second light-emission signal EM(n+1) is applied thereto, a charge sharing phenomenon between the third node N3 and the fourth node N4 can occur the moment when a level of the first light-emission signal EM(n) changes to a low level as a turn-on level, for the emission period Te. For example, the moment when the organic light-emitting element OLED emits light, black failure can occur due to the charge sharing phenomenon even though a black image is intended to be rendered. In the black failure, the image is rendered at a low gray level of about 0.7 to 1 nit rather than a black gray level.

Therefore, in one embodiment of the present disclosure, when the sixth transistor T6 is driven using the second light-emission signal EM(n+1), and even when a level of the first light-emission signal EM(n) is changed to a low level as a turn-on level for the emission period Te, the reset voltage VAR of the voltage level lower than the operation voltage of the organic light-emitting element OLED is supplied to the fourth node N4. Thus, the organic light-emitting element OLED does not emit light, and the third node N3 and the fourth node N4 can be at the same potential, for example, the reset voltage VAR level.

In addition, because the reset voltage VAR is continuously applied to the fourth node N4 for a rest of the period except for the emission period Te, the fourth node N4 may not be in a floating state or increase in a potential thereof may not occur due to the floating state. Even when the fourth transistor T4 is turned on based on the first light-emission signal EM(n), the potential of the fourth node N4 can depend on the reset voltage VAR until the second light-emission signal EM(n+1) is turned off.

Moreover, referring to FIG. 3 and FIG. 5E, during the emission period Te, each of the first light-emission signal EM(n) and the third light-emission signal EM(n+2) has a low level as a turn-on level. Accordingly, the third transistor T3 is turned on, such that the high potential drive voltage VDD is applied to the first node N1. Moreover, because the second node N2 is coupled to the high potential drive voltage VDD through the storage capacitor Cst, the high potential drive voltage VDD is reflected at the second node N2. Moreover, the fourth transistor T4 is turned on such that a current path between the third node N3 and the fourth node N4 is formed. As a result, a drive current Ioled passing through the source and drain electrodes of the driving transistor DT is applied to the organic light-emitting element OLED.

Moreover, referring to FIG. 4, during the sampling period Ts of the reset frame, the first scan signal SC1(*n*) is maintained at a low level as a turn-off level, and the second scan signal SC2(*n*) is maintained at a high level as a turn-off level. Accordingly, the data voltage Vdata is not programmed in each pixel P during the reset frame.

However, each of the first light-emission signal EM(n), the second light-emission signal EM(n+1), the third light-emission signal EM(n+2) and the third scan signal SC3(*n*) swings periodically. For example, because the third scan signal SC3(*n*) swings periodically, the reset frame can include a plurality of stress periods Tobs.

For example, during the reset frame, the anode electrode of the organic light-emitting element OLED can be reset based on the reset voltage VAR, and the bias stress can be applied to the third node N3 as the drain electrode of the driving transistor DT.

Eventually, in the organic light-emitting display device according to one embodiment of the present disclosure, the anode electrode of the organic light-emitting element OLED can be periodically reset over the refresh frame and the reset frame. As a result, the continuous increase in the voltage of the anode electrode of the organic light-emitting element OLED due to the leakage current can be prevented, so that the anode electrode of the organic light-emitting element OLED can maintain a constant voltage level. Therefore, the luminance change of the organic light-emitting display device can be minimized and, thus, the image quality thereof can be improved.

Figure 6A:
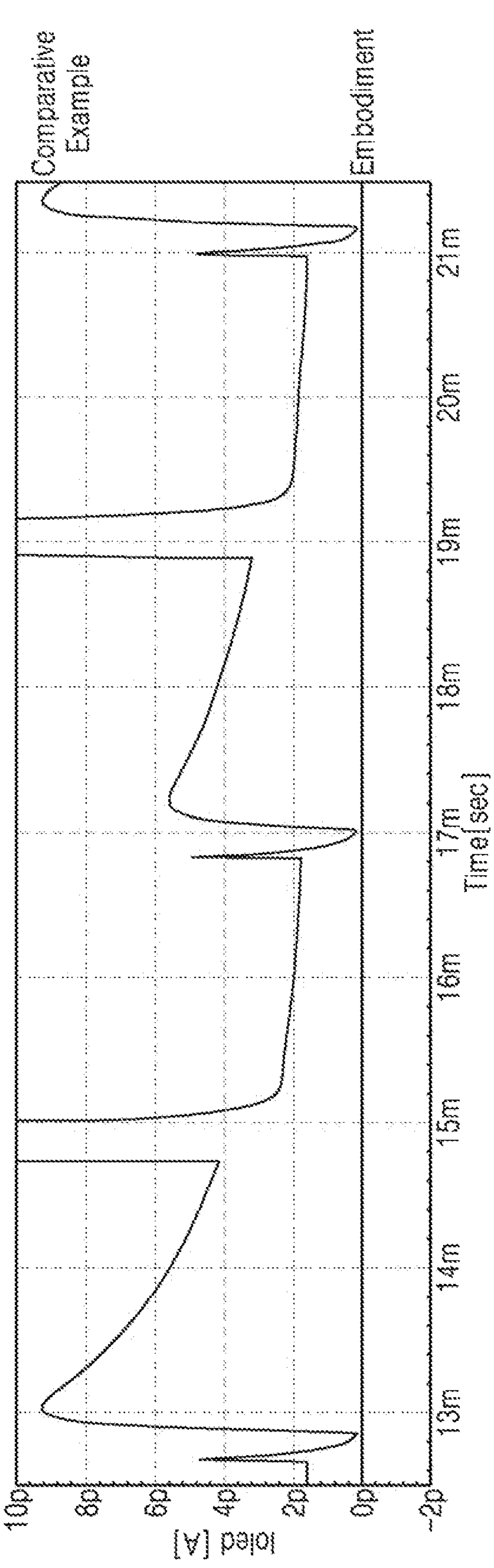
FIG. 6A to FIG. 6C are diagrams showing improvements of an organic light-emitting display device according to one embodiment of the present disclosure over a comparative example.
Figure 6B:
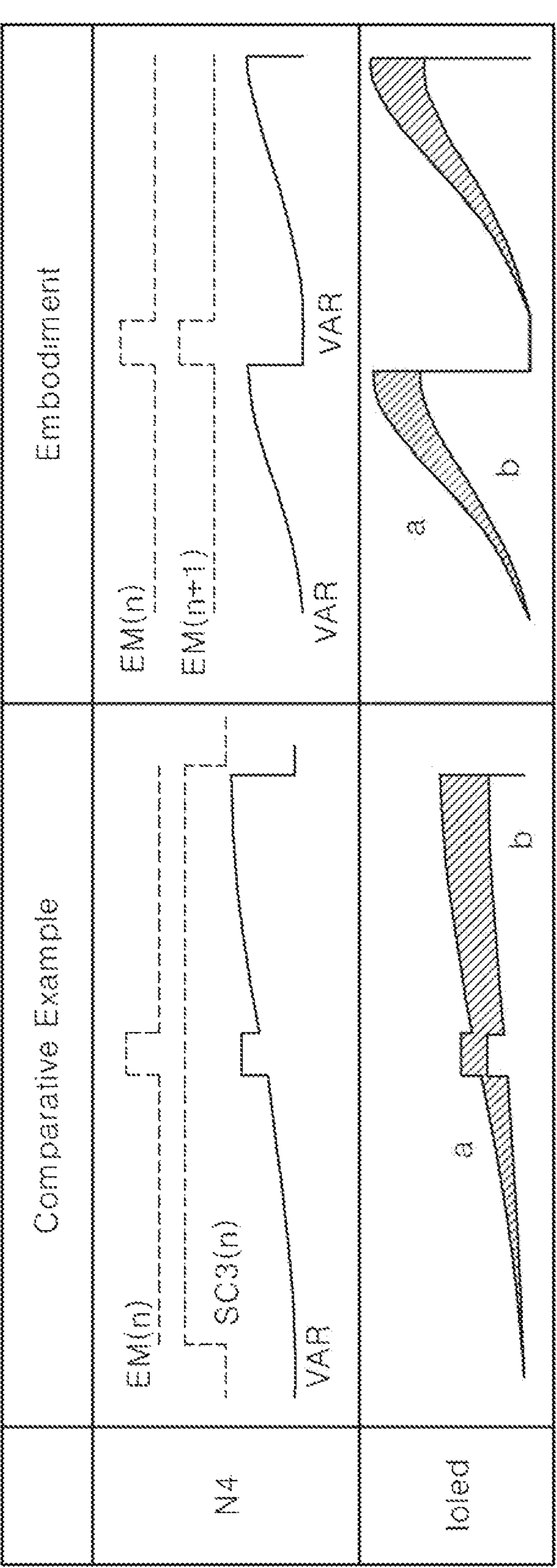
Figure 6C:
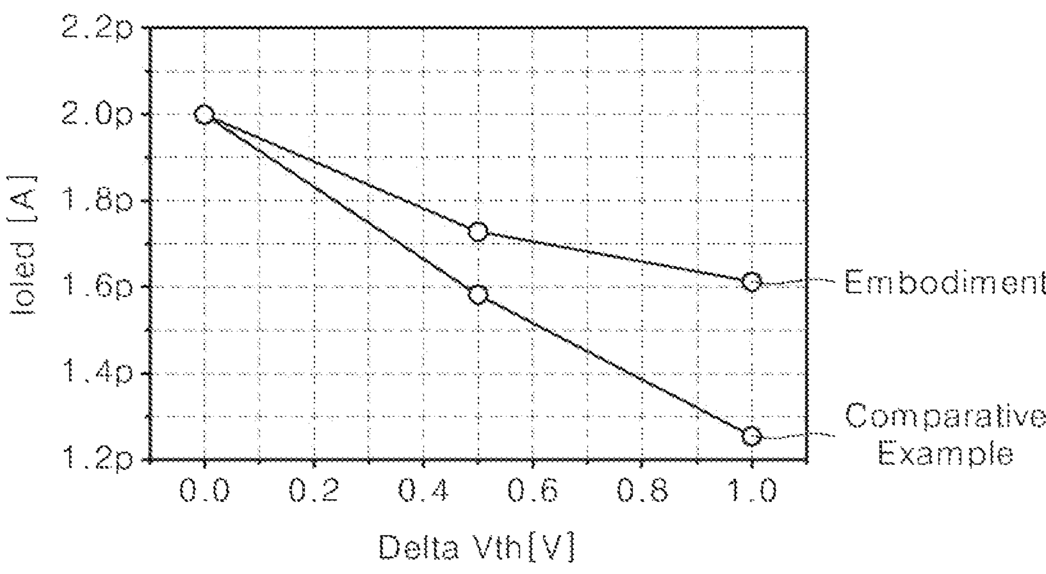

FIG. 6A to FIG. 6C are diagrams showing improvements of an organic light-emitting display device according to one embodiment of the present disclosure over a comparative example.

FIG. 6A is a diagram showing a change amount of the drive current Ioled flowing in the organic light-emitting element OLED in the pixel of the organic light-emitting display device according to one embodiment of the present disclosure. It can be identified that in the Comparative Example, when the sixth transistor T6 is driven based on the third scan signal SC3(*n*), the drive current Ioled is not constant but varies based on the charge sharing phenomenon between the third node N3 the fourth node N4 the moment when the first light-emission signal EM(n) changes to the low level as the turn-on level.

On the contrary, in the embodiment, the transistor is driven using the second light-emission signal EM(n+1). Thus, the fourth node N4 is fixed to the reset voltage VAR until the second light-emission signal EM(n+1) changes to a low level as a turn-off level. Thus, the drive current Ioled does not change and can be maintained at a fixed value.

In other words, during the reset period Tar, the drive current Ioled is not affected by the change of the scan signal and is fixed to a constant value. Thus, even when a voltage level difference between the reset voltage VAR and the low potential drive voltage VSS up to 1.7V occurs, the black failure may not occur.

FIG. 6B is a diagram showing the reset voltage VAR and the drive current Ioled of the fourth node N4 in the pixel of the organic light-emitting display device according to one embodiment of the present disclosure. Further, in FIG. 6B, "a" refers to the drive current Ioled in a pixel in a bright part of the display panel 100, and "b" refers to the drive current Ioled in a pixel in a dark part of the display panel 100.

In the Comparative Example, the sixth transistor T6 supplying the reset voltage VAR to the fourth node N4 is embodied as a p-type MOSFET (PMOS), and thus, the reset voltage VAR is applied thereto, and gradually increases when the third scan signal SC3(*n*) is at a high level. In this regard, as the first light-emission signal EM(n) changes to a high level as a turn-on level, the third node N3 and the fourth node N4 are brought into a charge sharing state, resulting in a peak at which the reset voltage VAR momentarily rises.

On the contrary, in the embodiment, an n-type MOSFET (NMOS) is applied. Thus, in contrast to the Comparative Example, when the first light-emission signal EM(n) has a high level as a turn-on level, the reset voltage VAR decreases. Therefore, the drive current Ioled decreases based on the reset voltage VAR, and, thus, a difference between the drive currents Ioled of the bright and dark areas can be reduced, so that the low gray level uniformity of the display panel 100 can be improved.

FIG. 6C is a diagram showing the drive current Ioled based on the uniformity of the threshold voltage Vth of the driving transistor DT in each pixel in the organic light-emitting display device according to one embodiment of the present disclosure.

The threshold voltage Vth of the driving transistor DT can vary depending on uniformity in the manufacturing process. In this regard, the greater the uniformity of the threshold voltage Vth, the greater the variation in the drive current Ioled flowing through organic light-emitting element OLED. In other words, when a pixel structure of the embodiment is applied, the vibration in the drive current Ioled is smaller than that in the Comparative Example, so that the low gray level uniformity of the display panel 100 can be improved.

As described above, in the organic light-emitting display device according to one embodiment of the present disclosure, the black failure phenomenon can be reduced, and the luminance variation of the low gray level can be minimized, so that the image quality thereof can be increased.

An organic light-emitting display device according to one embodiment of the present disclosure can be described as follows.

One aspect of the present disclosure provides an organic light-emitting display device comprising a plurality of pixels arranged in a display panel, wherein each of the plurality of pixels includes an organic light-emitting element for emitting light based on drive current, a driving transistor for controlling the drive current, wherein the driving transistor includes a source electrode acting as a first node, a gate electrode acting as a second node, and a drain electrode acting as a third node, a first transistor for connecting the second node and the third node to each other in a diode manner, a second transistor for applying a data voltage to the first node, a third transistor for applying a high potential drive voltage VDD to the first node, a fourth transistor for forming a current path between the driving transistor and the organic light-emitting element, a fifth transistor for selectively applying a stress voltage Vobs and an initialization voltage Vini to the third node, and a sixth transistor for applying a reset voltage VAR to a fourth node as an anode electrode of the organic light-emitting element.

In one embodiment of the organic light-emitting display device, the organic light-emitting display device operates separately in a refresh frame and a reset frame, wherein in the refresh frame, the data voltage is programmed in the pixel, and in the reset frame, the anode electrode of the organic light-emitting element is reset, wherein the refresh frame is divided into a stress period, an initial period, a sampling period, a reset period and an emission period, wherein during the stress period, a bias stress is applied to the driving transistor, wherein during the initial period, the second node or the third node is initialized based on the initialization voltage, wherein during the sampling period, the second node is charged to a voltage corresponding to a sum of the data voltage and a threshold voltage Vth of the driving transistor, wherein during the reset period, the fourth node is reset based on the reset voltage VAR, wherein during the emission period, the drive current is applied to the organic light-emitting element so that the organic light-emitting element emits light.

In one embodiment of the organic light-emitting display device, when the fourth transistor is turned on for the reset period, the third node and the fourth node are at the same potential equal to the reset voltage.

In one embodiment of the organic light-emitting display device, each of the first transistor and the sixth transistor include an n-type MOSFET.

In one embodiment of the organic light-emitting display device, each of the driving transistor, the second transistor, the third transistor, the fourth transistor and the fifth transistors includes a p-type MOSFET.

In one embodiment of the organic light-emitting display device, each of the first transistor and the sixth transistor includes an oxide thin-film transistor.

In one embodiment of the organic light-emitting display device, each of the driving transistor, the second transistor, the third transistor, the fourth transistor and the fifth transistors includes a low-temperature polycrystalline silicon thin-film transistor.

In one embodiment of the organic light-emitting display device, the first transistor includes a drain electrode connected to the third node, a source electrode connected to the second node, and a gate electrode connected to a first scan signal line for transmitting a first scan signal, wherein the second transistor includes a source electrode connected to a data line, a drain electrode connected to the first node, and a gate electrode connected to a second scan signal line for transmitting a second scan signal, wherein the third transistor includes a source electrode connected to a high potential drive voltage line for transmitting the high potential drive voltage, a drain electrode connected to the first node, and a gate electrode connected to a third light-emission signal line for transmitting a third light-emission signal, wherein the fourth transistor includes a source electrode connected to the third node, a drain electrode connected to the fourth node, and a gate electrode connected to a first light-emission signal line for transmitting a first light-emission signal, wherein the fifth transistor includes a source electrode connected to a digital initialization voltage line for selectively transmitting the stress voltage or the initialization voltage, a drain electrode connected to the third node, and a gate electrode connected to a third scan signal line for transmitting a third scan signal, wherein the sixth transistor includes a source electrode connected to a reset voltage line for transmitting the reset voltage, a drain electrode connected to the fourth node, and a gate electrode connected to a second light-emission signal line for transmitting a second light-emission signal.

In one embodiment of the organic light-emitting display device, the organic light-emitting display device further comprises a storage capacitor having one electrode connected to the second node.

One aspect of the present disclosure provides an organic light-emitting display device comprising a plurality of pixels arranged in a display panel, wherein each of the plurality of pixels includes an organic light-emitting element, a driving transistor for supplying drive current to the organic light-emitting element, wherein the driving transistor includes a source electrode acting as a first node, a gate electrode acting as a second node, and a drain electrode acting as a third node, and a reset transistor for applying a reset voltage to a fourth node as an anode electrode of the organic light-emitting element, wherein each of the plurality of pixels operates separately in a stress period, an initial period, a sampling period, a reset period, and an emission period, wherein during the stress period, a bias stress is applied to the driving transistor, wherein during the initial period, the second node or the third node is initialized based on an initialization voltage, wherein during the sampling period, the second node is charged to a voltage corresponding to a sum of a data voltage and a threshold voltage of the driving transistor, wherein during the reset period, the reset transistor resets the fourth node based on the reset voltage, wherein during the emission period, the drive current is applied to the organic light-emitting element so that the organic light-emitting element emits light.

In one embodiment of the organic light-emitting display device, during the reset period, the third node and the fourth node are at the same potential equal to the reset voltage.

In one embodiment of the organic light-emitting display device, the driving transistor includes a p-type MOSFET.

In one embodiment of the organic light-emitting display device, the driving transistor includes a low-temperature polycrystalline silicon thin-film transistor.

In one embodiment of the organic light-emitting display device, the reset transistor includes an n-type MOSFET.

In one embodiment of the organic light-emitting display device, the reset transistor includes an oxide thin-film transistor.

One aspect of the present disclosure provides an organic light-emitting display device comprising a plurality of pixels arranged in a display panel, wherein each of the plurality of pixels includes an organic light-emitting element, a driving transistor for supplying drive current to the organic light-emitting element, wherein the driving transistor includes a source electrode acting as a first node, a gate electrode acting as a second node, and a drain electrode acting as a third node, and a reset transistor for applying a reset voltage to a fourth node as an anode electrode of the organic light-emitting element so that the third node and the fourth node are at the same potential equal to the reset voltage during a reset period in a refresh frame, wherein in the refresh frame, a data voltage is programmed in the pixel, the reset period is a period for which a voltage level of the anode electrode of the organic light-emitting element is fixed to the reset voltage for a rest of the period except for a emission period in the refresh frame, and during the emission period, the drive current is applied to the organic light-emitting element so that the organic light-emitting element emits light.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An organic light-emitting display device comprising:

a plurality of pixels arranged in a display panel, wherein each of the plurality of pixels includes:

an organic light-emitting element configured to emit light based on a drive current;

a driving transistor configured to control the drive current, wherein the driving transistor includes a source electrode acting as a first node, a gate electrode acting as a second node, and a drain electrode acting as a third node;

a first transistor connecting the second node and the third node to each other in a diode manner;

a second transistor configured to apply a data voltage to the first node;

a third transistor configured to apply a high potential drive voltage to the first node;

a fourth transistor configured to form a current path between the driving transistor and the organic light-emitting element;

a fifth transistor configured to selectively apply a stress voltage and an initialization voltage to the third node; and a sixth transistor configured to apply a reset voltage to a fourth node as an anode electrode of the organic light-emitting element, wherein, during a reset period of a refresh frame, the reset voltage is applied to the anode electrode of the organic light-emitting element, and the fourth transistor is turned on during the reset period so that the third node and the fourth node are at a same potential, wherein the fourth transistor is driven by a first light-emission signal, wherein the sixth transistor is driven by a second light-emission signal, wherein the third transistor is driven by a third light-emission signal, and wherein the first light-emission signal, the second light-emission signal and the third light-emission signal are sequentially delayed in timing.

2. The organic light-emitting display device of claim 1, wherein the organic light-emitting display device operates separately in the refresh frame and a reset frame, wherein in the refresh frame, the data voltage is programmed in each pixel, and in the reset frame, the anode electrode of the organic light-emitting element is reset, wherein the refresh frame is divided into a stress period, an initial period, a sampling period, the reset period and an emission period, wherein during the stress period, a bias stress is applied to the driving transistor, wherein during the initial period, the second node or the third node is initialized based on the initialization voltage, wherein during the sampling period, the second node is charged to a voltage corresponding to a sum of the data voltage and a threshold voltage of the driving transistor, wherein during the reset period, the fourth node is reset based on the reset voltage, and wherein during the emission period, the drive current is applied to the organic light-emitting element so that the organic light-emitting element emits light.

3. The organic light-emitting display device of claim 1, wherein each of the first transistor and the sixth transistor include an n-type MOSFET.

4. The organic light-emitting display device of claim 1, wherein each of the driving transistor, the second transistor, the third transistor, the fourth transistor and includes a p-type MOSFET.

5. The organic light-emitting display device of claim 1, wherein each of the first transistor and the sixth transistor includes an oxide thin-film transistor.

6. The organic light-emitting display device of claim 1, wherein each of the driving transistor, the second transistor, the third transistor, the fourth transistor and the fifth transistor includes a low-temperature polycrystalline silicon thin-film transistor.

7. The organic light-emitting display device of claim 1, wherein the first transistor includes a drain electrode connected to the third node, a source electrode connected to the second node, and a gate electrode connected to a first scan signal line for transmitting a first scan signal, wherein the second transistor includes a source electrode connected to a data line, a drain electrode connected to the first node, and a gate electrode connected to a second scan signal line for transmitting a second scan signal, wherein the third transistor includes a source electrode connected to a high potential drive voltage line for transmitting the high potential drive voltage, a drain electrode connected to the first node, and a gate electrode connected to a third light-emission signal line for transmitting the third light-emission signal, wherein the fourth transistor includes a source electrode connected to the third node, a drain electrode connected to the fourth node, and a gate electrode connected to a first light-emission signal line for transmitting the first light-emission signal, wherein the fifth transistor includes a source electrode connected to a digital initialization voltage line for selectively transmitting the stress voltage or the initialization voltage, a drain electrode connected to the third node, and a gate electrode connected to a third scan signal line for transmitting a third scan signal, and wherein the sixth transistor includes a source electrode connected to a reset voltage line for transmitting the reset voltage, a drain electrode connected to the fourth node, and a gate electrode connected to a second light-emission signal line for transmitting the second light-emission signal.

8. The organic light-emitting display device of claim 1, wherein the organic light-emitting display device further comprises:

a storage capacitor having one electrode connected to the second node.

9. An organic light-emitting display device comprising:

a plurality of pixels arranged in a display panel, wherein each of the plurality of pixels includes:

an organic light-emitting element;

a driving transistor configured to supply a drive current to the organic light-emitting element, wherein the driving transistor includes a source electrode acting as a first node, a gate electrode acting as a second node, and a drain electrode acting as a third node; and a third transistor configured to apply a high potential drive voltage to the first node;

a transistor configured to form a current path between the driving transistor and the organic light-emitting element; and a reset transistor configured to apply a reset voltage to a fourth node as an anode electrode of the organic light-emitting element, wherein each of the plurality of pixels operates separately in a stress period, an initial period, a sampling period, a reset period, and an emission period, wherein during the stress period, a bias stress is applied to the driving transistor, wherein during the initial period, the second node or the third node is initialized based on an initialization voltage, wherein during the sampling period, the second node is charged to a voltage corresponding to a sum of a data voltage and a threshold voltage of the driving transistor, wherein during the reset period, the reset transistor resets the fourth node based on the reset voltage, wherein during the emission period, the drive current is applied to the organic light-emitting element so that the organic light-emitting element emits light, wherein the transistor configured to form the current path is driven by a first light-emission signal, wherein the reset transistor is driven by a second light-emission signal, wherein the third transistor is driven by a third light-emission signal, and wherein the first light-emission signal, the second light-emission signal and the third light-emission signal are sequentially delayed in timing.

10. The organic light-emitting display device of claim 9, wherein during the reset period, the third node and the fourth node are at a same potential equal to the reset voltage.

11. The organic light-emitting display device of claim 9, wherein the driving transistor includes a p-type MOSFET.

12. The organic light-emitting display device of claim 9, wherein the driving transistor includes a low-temperature polycrystalline silicon thin-film transistor.

13. The organic light-emitting display device of claim 9, wherein the reset transistor includes an n-type MOSFET.

14. The organic light-emitting display device of claim 9, wherein the reset transistor includes an oxide thin-film transistor.

15. An organic light-emitting display device comprising:

a plurality of pixels arranged in a display panel, wherein each of the plurality of pixels includes:

an organic light-emitting element;

a driving transistor configured to supply a drive current to the organic light-emitting element, wherein the driving transistor includes a source electrode acting as a first node, a gate electrode acting as a second node, and a drain electrode acting as a third node;

a third transistor configured to apply a high potential drive voltage to the first node;

a transistor configured to form a current path between the driving transistor and the organic light-emitting element; and a reset transistor configured to apply a reset voltage to a fourth node as an anode electrode of the organic light-emitting element so that the third node and the fourth node are at a same potential equal to the reset voltage during a reset period in a refresh frame, wherein in the refresh frame, a data voltage is programmed in each pixel, the reset period is a period for which a voltage level of the anode electrode of the organic light-emitting element is fixed to the reset voltage for a rest of the period except for an emission period in the refresh frame, and during the emission period, the drive current is applied to the organic light-emitting element so that the organic light-emitting element emits light, and wherein, during the reset period, the reset voltage is applied to the anode electrode of the organic light-emitting element, and the transistor is turned on during the reset period so that the third node and the fourth node are at a same potential equal, wherein the transistor configured to form the current path is driven by a first light-emission signal, wherein the reset transistor is driven by a second light-emission signal, wherein the third transistor is driven by a third light-emission signal, and wherein the first light-emission signal, the second light-emission signal and the third light-emission signal are sequentially delayed in timing.

* * * * *